United States Patent [19]
Uchino et al.

[11] Patent Number: 5,105,239
[45] Date of Patent: Apr. 14, 1992

[54] REFLECTIVE TYPE OPTICAL SENSOR DEVICE

[75] Inventors: Tsuguo Uchino, Kitakyushu; Matsumi Ichimura, Yokohama, both of Japan

[73] Assignee: Kabushiki Kaisha Toshiba, Kawasaki, Japan

[21] Appl. No.: 565,431

[22] Filed: Aug. 10, 1990

[30] Foreign Application Priority Data

Aug. 11, 1989 [JP] Japan .................................. 1-208807

[51] Int. Cl.$^5$ ..................... H01L 31/12; H01L 31/16; H01L 23/16
[52] U.S. Cl. ........................................ 357/19; 357/17; 357/30; 357/75; 357/80
[58] Field of Search ............... 357/19, 17, 30 D, 30 L, 357/30 P, 75, 80

[56] References Cited

U.S. PATENT DOCUMENTS 4,368,481 1/1983 Ohashi et al. .......................... 357/19

FOREIGN PATENT DOCUMENTS

| | | | |
|---|---|---|---|
| 56-48188 | 5/1981 | Japan | 357/19 |
| 59-154083 | 9/1984 | Japan | 357/19 |
| 62-132377 | 6/1987 | Japan | 357/19 |
| 63-104486 | 5/1988 | Japan | 357/19 |
| 63-138785 | 6/1988 | Japan | 357/19 |

*Primary Examiner*—Andrew J. James
*Assistant Examiner*—Ngan Van Ngo
*Attorney, Agent, or Firm*—Finnegan, Henderson, Farabow, Garrett and Dunner

[57] ABSTRACT

Receiving sections for receiving light emitting and light receiving elements are formed in a housing. The axes of the light emitting and light receiving elements which are inserted into the receiving sections are optically coupled at a preset angle. Further, light transmission windows are formed in the housing in front of the light emitting and light receiving elements which are inserted into the receiving sections, and the opening area of the light transmission window on the light receiving element side is made smaller than that of the light transmission window on the light emitting element side.

10 Claims, 8 Drawing Sheets

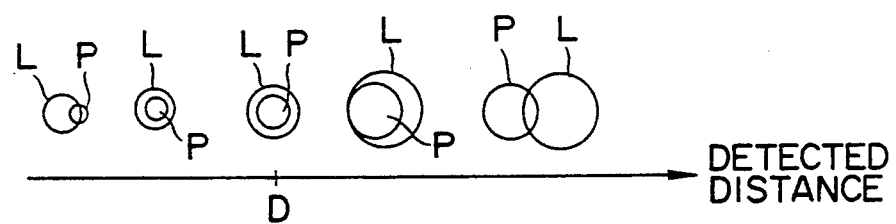
F I G. 11
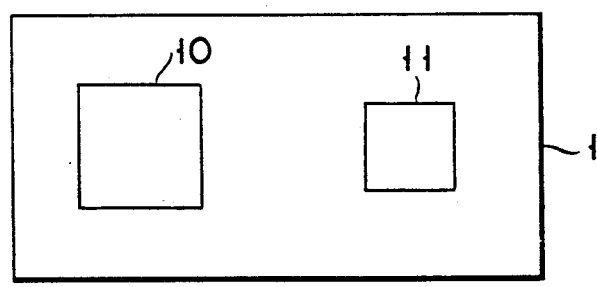
F I G. 12

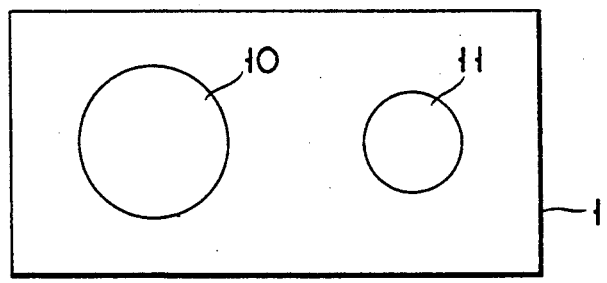
F I G. 13
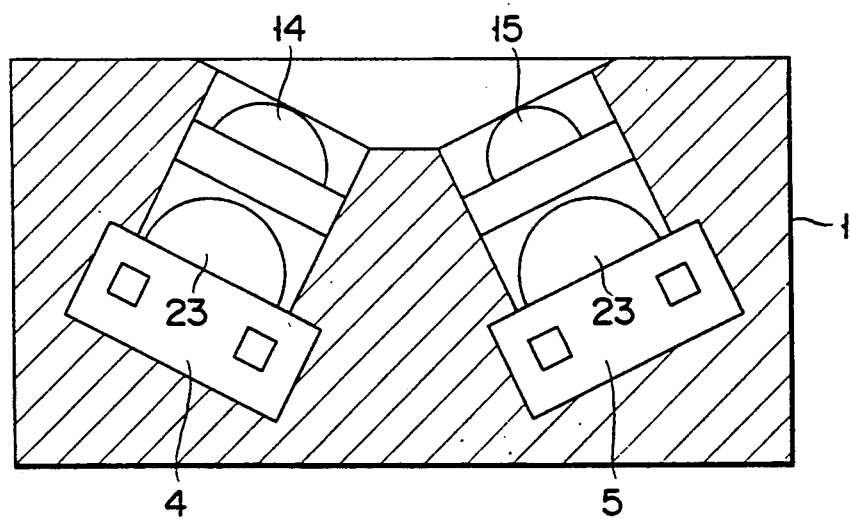
F I G. 14

REFLECTIVE TYPE OPTICAL SENSOR DEVICE

FIELD OF THE INVENTION

1. Field of the Invention

This invention relates to a reflective type optical sensor device having a light emitting element and a light receiving element, for detecting an object by sensing the light which is emitted from the light emitting element and reflected at a to-be-detected object by means of the light receiving element.

2. Description of the Related Art

FIG. 1 is a diagram showing a conventional reflective type optical sensor device partly in cross section. In FIG. 1, a reference numeral 31 denotes a housing formed of plastic material, for example. In the housing 31, receiving sections are provided in two positions. For example, in one of the two receiving sections, a light emitting element 32 such as a infrared light emitting diode is inserted, and in the other receiving section, a light receiving element 33 such as a phototransistor is inserted. The above light emitting and light receiving elements are arranged with the optical axes thereof set to intersect at a preset optical coupling angle $\theta$ ($\theta \geq 180°$, preferabley $\theta = 25°$ to $40°$) so as to constitute a reflective type optical sensor device.

A reference numeral 34 denotes a to-be-detected object disposed in front of the reflective type optical sensor device and reference numerals 35 and 36 respectively denote light transmission windows formed in positions facing the two receiving sections.

Further, as shown in FIG. 2, there is also provided a reflective optical sensor device in which condenser lenses 37 and 38 are respectively mounted in front of the light emitting element 32 and light receiving element 33.

In the sensor device having a construction of FIG. 1, preset clearances are provided between the light emitting and receiving elements and the receiving sections so as to make it easy to insert the light emitting and receiving elements into the respective receiving sections. Therefore, when the light emitting and receiving elements are inserted into the respective receiving sections, the light emitting and receiving elements are inserted in positions deviated from the normal positions so that the optical axes (optical coupling angle) thereof may be deviated, thereby changing the light transmission characteristic. Variation in the light transmission characteristic appears as reduction in the collector current of a portion on the light receiving section side and variation in the peak position of the detected distance characteristic.

FIG. 3 is a characteristic diagram showing the variation state of the detected distance characteristic obtained when the optical axis is deviated as shown in FIG. 1, and the abscissa indicates a detected distance and the ordinate indicates the collector current value (relative value) of a phototransistor used as the light receiving element. In the drawing, a solid line indicates a characteristic obtained when an angle made by the optical axes is set to a normal angle $\theta 0$ shown in FIG. 1, broken lines indicate a characteristic obtained when the optical axes intersect at an angle of $\theta 1$ ($\theta 1 < \theta 0$) which is set to be smaller than the normal angle $\theta 0$ and one-dot-dash lines indicate a characteristic obtained when the optical axes intersect at an angle of $\theta 2$ ($\theta 2 > \theta 0$) which is set to be larger than the normal angle $\theta 0$.

Assume now that the detected distance with the angle set at $\theta 0$ is D0 as shown in FIGS. 1 and 2. Then, the detected distance with the angle set at $\theta 1$ becomes D1 which is shorter than D0 and the detected distance with the angle set at $\theta 2$ becomes D2 which is longer than D0.

FIG. 4 shows that light emitting spot area L on the surface of the to-be-detected object 34 onto which light is projected and that light receiving spot area P in which the light receiving element 33 can sense the light when the detected distances are D0, D1 and D2. An area on which both the areas are overlapped is an area in which an optical coupling occurs.

In this way, if an angle made by the optical axes of the light emitting element and light receiving element varies, the detected distance may vary.

As described above, in the conventional sensor device shown in FIG. 1, the detected distance characteristic for each device may be different and therefore it becomes necessary for the user to effect the adjustment and set the detected distance, making it extremely troublesome to handle the device. Further, if the to-be-detected object is thin like a sheet of paper and when the object which is made in a wavy form is detected, the possibility of erroneously detecting the object becomes large.

Further, in the case of the sensor device for converging the light by use of the externally mounted lenses as shown in FIG. 2, a clearance is also provided between the housing and the externally mounted lenses and the device is formed to have a narrow directivity so that the defect of the device shown in FIG. 1 may become further significant.

SUMMARY OF THE INVENTION

This invention has been made in view of the above problems and an object of this invention is to provide a reflective type optical sensor device in which variation in the light transmission characteristic which is the problem in the conventional sensor device is suppressed so that erroneous detection can be prevented and the adjustment can be simplified or omitted.

According to this invention, there is provided a reflective type optical sensor device comprising a housing in which a plurality of receiving sections for receiving light emitting and light receiving elements are provided and the axes of the light emitting and light receiving elements received in the receiving sections are optically coupled at a preset angle; and light transmission windows formed in the housing in front of the respective light emitting and light receiving elements received in the receiving sections; wherein the opening area of the light transmission window on the light receiving element side is made smaller than that of the light transmission window on the light emitting element side.

According to this invention, there is provided a reflective type optical sensor device comprising a housing in which a plurality of receiving sections for receiving light emitting and light receiving elements are provided and the axes of the light emitting and light receiving elements received in the receiving sections are optically coupled at a preset angle; light transmission windows formed in the housing in front of the respective light emitting and light receiving elements received in the receiving sections and condenser lenses mounted in the housing in front of the light emitting plane of the light emitting element and the light receiving plane of the light receiving element; wherein the curvature of the condenser lens on the light receiving element side is made smaller than that of the condenser lens on the light emitting element side.

According to this invention, there is provided a reflective type optical sensor device comprising a housing in which a plurality of receiving sections for receiving light emitting and light receiving elements are provided and the axes of the light emitting and light receiving elements received in the receiving sections are optically coupled at a preset angle; a light emitting element received in one of the receiving sections and having an outer casing in which a light emitting diode chip is sealed and a lens unit having a preset curvature is integrally formed therewith; a light receiving element received in the other one of the receiving sections and having an outer casing in which a phototransistor chip is sealed and a lens unit having a preset curvature is integrally formed therewith; and light transmission windows formed in the housing in front of the respective light emitting and light receiving elements received in the receiving sections; wherein the curvature of the lens formed on the outer casing on the light receiving element side is made smaller than that of the lens formed on the outer casing on the light emitting element side.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIG. 11 is a diagram showing light emitting and light receiving spots of the light emitting and light receiving elements in the device of the above embodiment;

FIG. 12 is a view showing the configuration of a window in the device of the above embodiment;

FIG. 13 is a view showing the configuration of a device according to another embodiment of this invention;

FIG. 14 is a view showing a device according to still another embodiment of this invention partly in cross section;

DETAILED DESCRIPTION OF THE PREFERRED EMBODIMENTS

There will now be described an embodiment of this invention with reference to the accompanying drawings.

Figure 1:
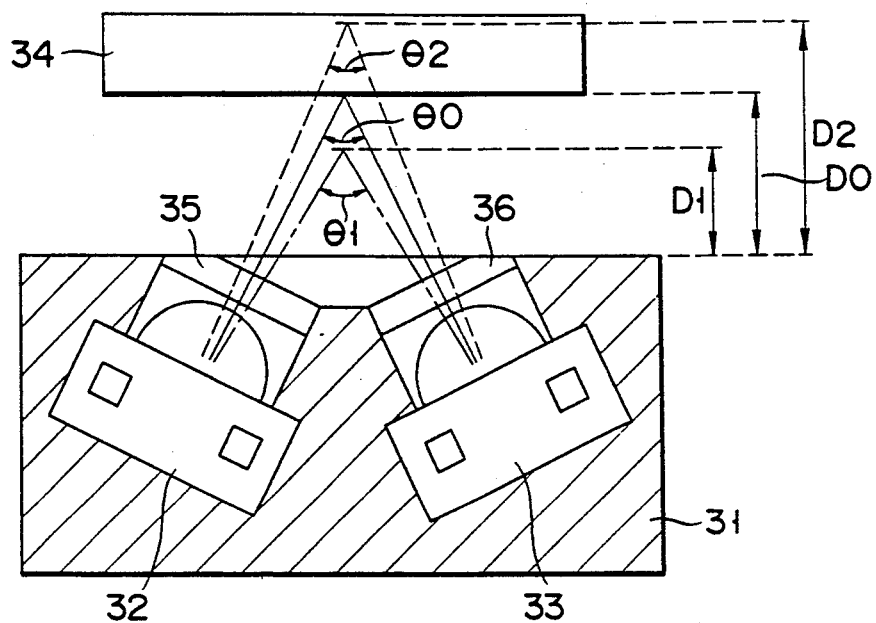
FIG. 1 is a view showing the construction of a conventional device partly in cross section.
Figure 2:
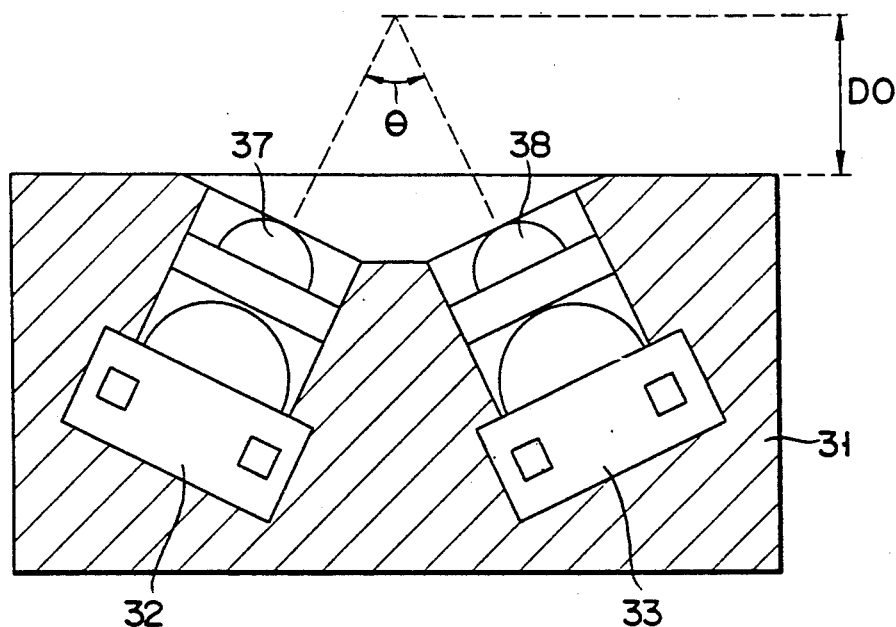
FIG. 2 is a view showing the construction of another conventional device partly in cross section.
Figure 3:
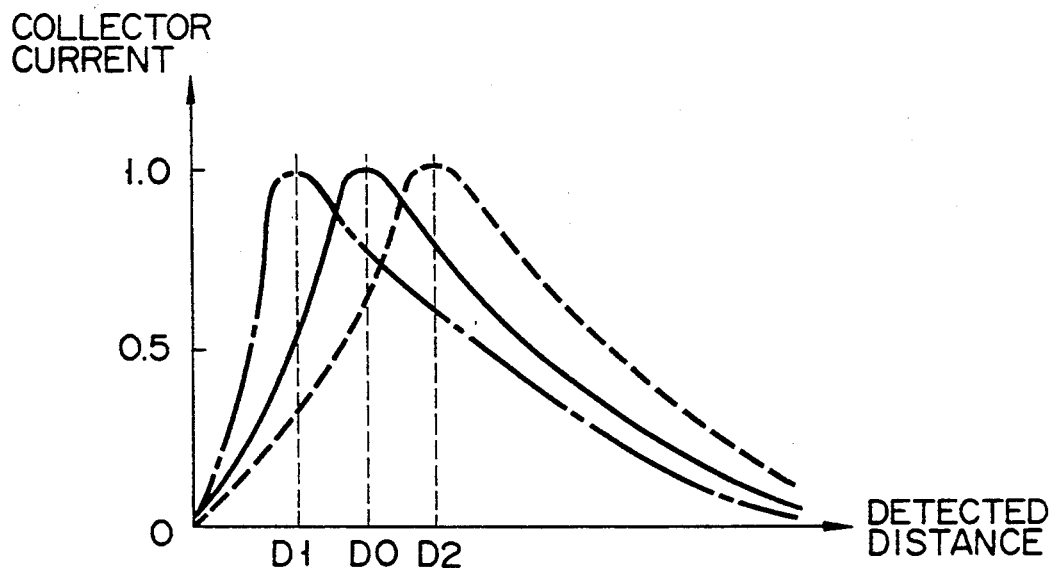
FIG. 3 is a characteristic diagram of the device shown in FIG. 1.
Figure 4:
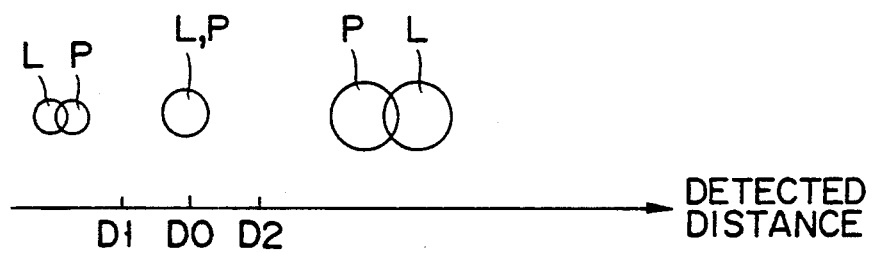
FIG. 4 is a diagram showing the areas of a light emitting spot and a light receiving spot with respect to various detected distances in the conventional device.
Figure 5:
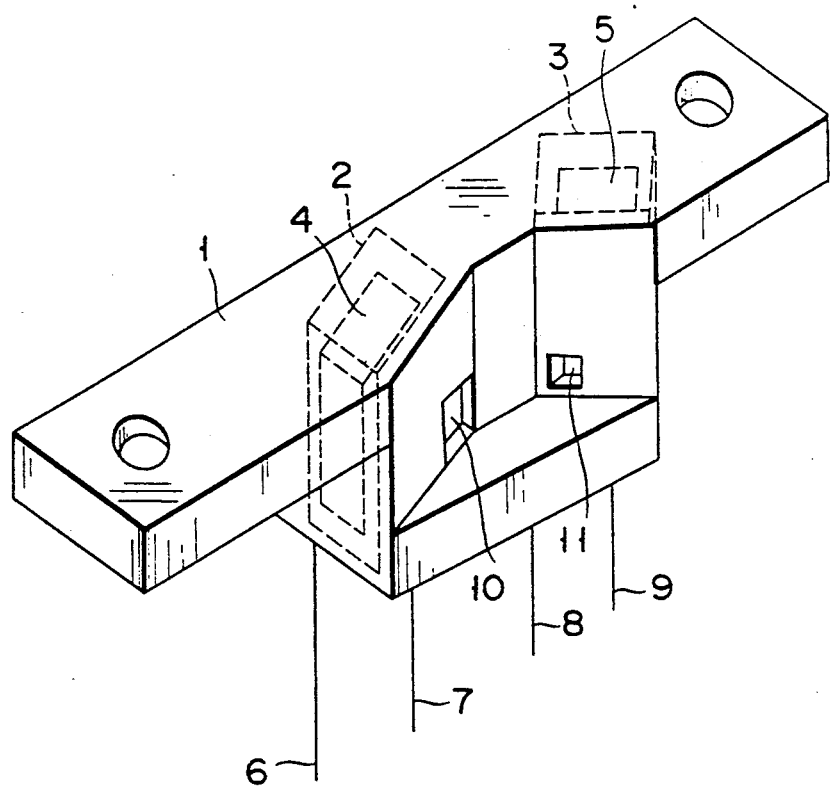
FIG. 5 is a perspective view showing the external configuration of one embodiment of a reflective type optical sensor according to this invention.

In FIG. 5, a reference numeral 1 denotes a housing formed of plastic material, for example, polycarbonate resin having black coloring matter mixed therein, and receiving sections 2 and 3 for receiving light emitting and light receiving elements are formed in the central portion thereof. A light emitting element such as an infrared light emitting diode 4 is inserted into the receiving section 2 and fixed therein by use of bonding agent. A light receiving element such as a phototransistor is inserted into the receiving section 5 and fixed therein by use of bonding agent. The light emitting and light receiving elements are so disposed that perpendiculars with respect to the main surfaces of the light emitting and light receiving elements intersect at one point with a preset angle in a range of 25 to 40 when the light emitting and light receivin elements are set in the receiving sections 2 and 3. Reference numerals 6 to 9 denote external leads for the infrared light emitting diode 4 and phototransistor 5.

Figure 6:
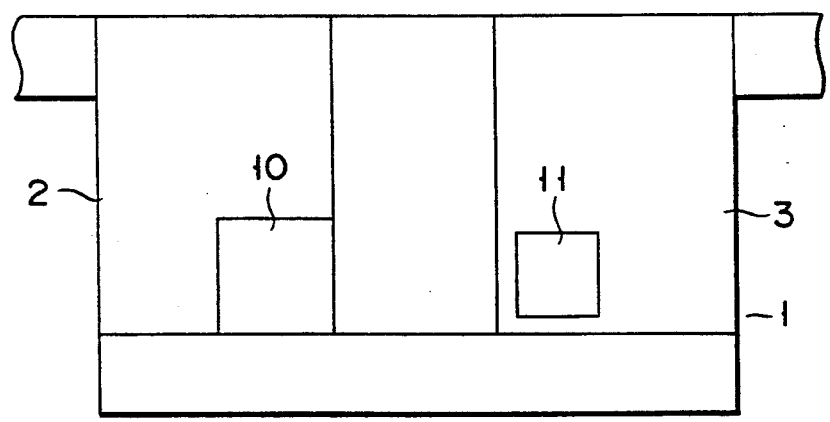
FIG. 6 is a front view of the device of the above embodiment.

Square light transmission windows 10 and 11 are formed in positions corresponding to the receiving sections 2 and 3 of the housing 1. As shown in the front view of FIG. 6, the windows 10 and 11 are so formed that the opening area of the window 11 formed in the receiving section 3 into which the phototransistor 5 o the light receiving side is inserted may be made smaller than that of the window 10 formed in the receiving section 2 into which the infrared light emitting diode 4 on the light emitting side is inserted.

Figure 7:
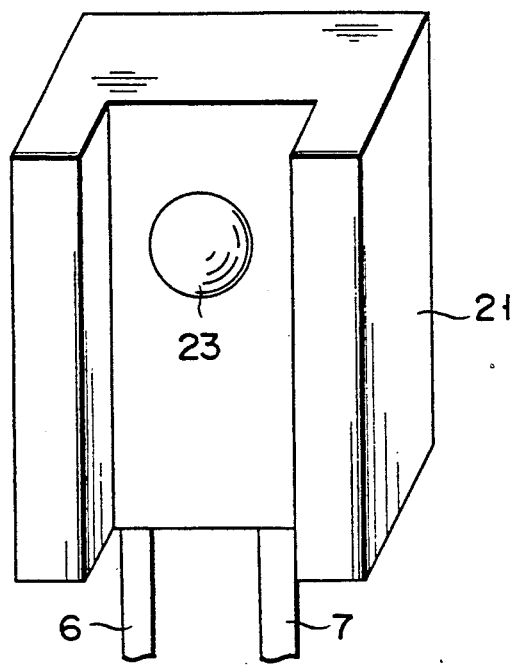
FIG. 7 is a perspective view of a light emitting element or light receiving element used in the device of the above embodiment.
Figure 8:
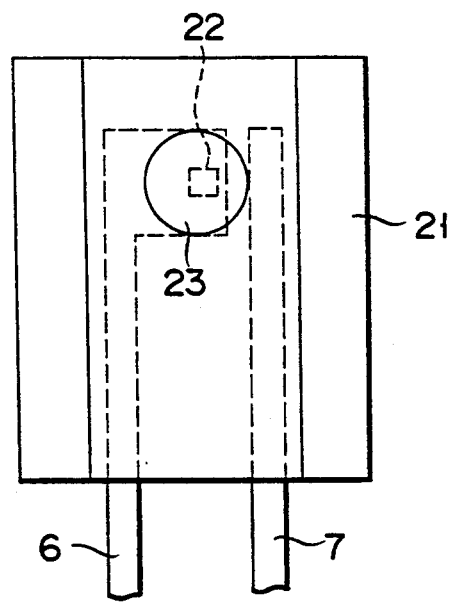
FIG. 8 is a front view of a light emitting element or light receiving element used in the device of the above embodiment.

FIG. 7 is a perspective view showing the detail construction of the infrared light emitting diode 4 and FIG. 8 is a front view thereof. The phototransistor 5 is formed in substantially the same manner as the infrared light emitting diode 4. In the drawing, a reference numeral 21 denotes an outer casing formed of plastic material. The tip end portions of the two leads 6 and 7 are sealed inside the outer casing 21. An infrared diode chip 22 is bonded to the lead 6 by a die bonding method. Further, an electrode (not shown) formed on the surface of the chip 22 is electrically connected to the tip end portion of the lead 7 via a bonding wire (not shown). A condenser lens 23 is formed integrally with the outer casing 21 in that part of the outer casing 21 which faces the chip 22.

Figure 9:
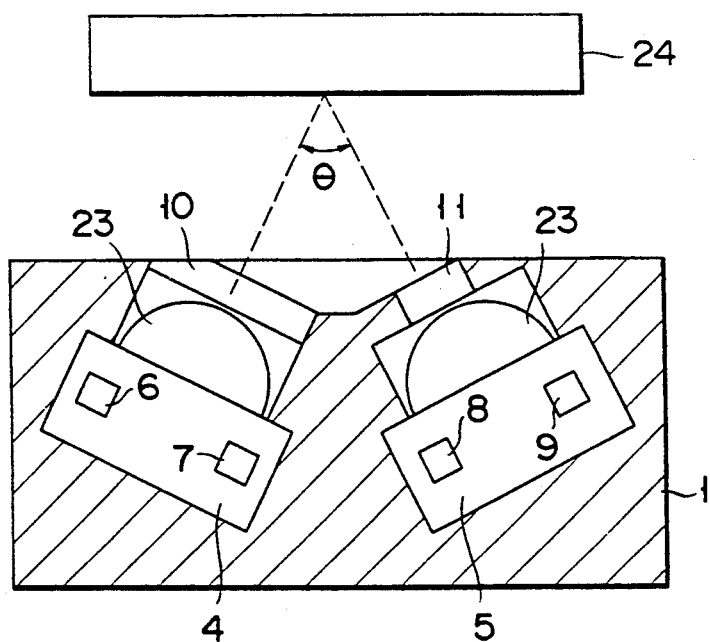
FIG. 9 is a view of the device of the above embodiment partly in cross section.

FIG. 9 is a partial cross sectional view showing the device of the above embodiment together with a to-be-detected object partly in cross section. In the drawing, an infrared light emitted from the light emitting diode chip in the infrared light emitting diode 4 is converged by means of the condenser lens 23 formed integrally with the outer casing of the infrared light emitting diode 4, transmitted through the window 10 formed in the housing 1 and projected onto the to-be-detected object 24. Light reflected from the to-be-detected object 24 is transmitted through the window 11, converged by means of the condenser lens 23 formed integrally with the outer casing of the phototransistor 5 and projected onto the phototransistor chip.

The receiving sections 2 and 3 of the housing 1 are so formed that perpendiculars with respect to the main surfaces of the infrared light emitting diode 4 and phototransistor 5 may intersect on the detection plane of the to-be-detected object 24 with a preset angle $\theta$ when the infrared light emitting diode 4 and phototransistor 5 are set in the receiving sections 2 and 3.

In the sensor device of the above embodiment, pre-set clearances are provided between the light emitting and receiving elements and the receiving sections so as to make it easy to insert the light emitting and receiving elements into the respective receiving sections 2 and 3. Therefore, when the light emitting and receiving elements are inserted into the respective receiving sections the light emitting and receiving elements are inserted in positions deviated from the normal positions so that the intersecting angle $\theta$ of the optical axes thereof may be deviated.

However, in the sensor device of the above embodiment, the opening area of the window 11 formed in the receiving section 3 into which the phototransistor 5 is inserted is set smaller than that of the window 10 formed in the receiving section 2 into which the infrared light emitting diode 4 is inserted. Therefore, even if the angle made by the axes of the infrared light emitting diode 4 and phototransistor 5 is deviated to some extent, variation caused in the detected distance can be suppressed to be extremely small.

Figure 10:
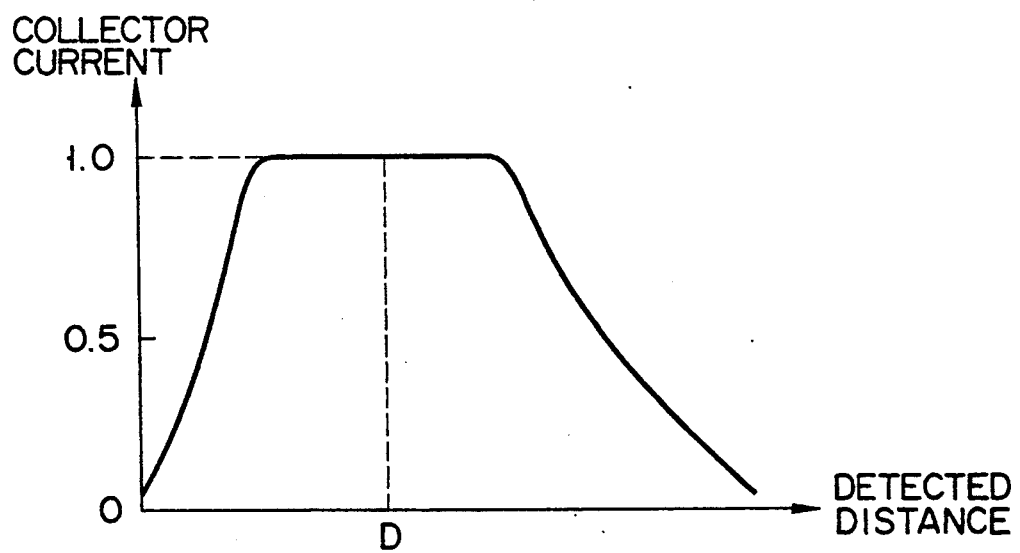
FIG. 10 is a characteristic diagram of the device of the above embodiment.
Figure 15:
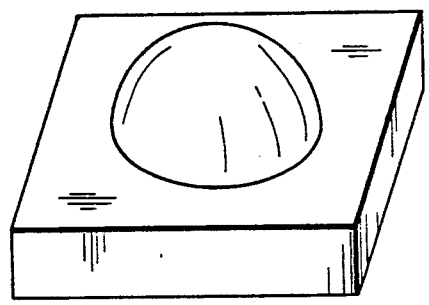
FIG. 15 is a perspective view showing the construction of a lens used in the device of the embodiment of FIG. 14.

FIG. 10 is a characteristic diagram of the detected distance in the device of the above embodiment. It is similar to the conventional case except that the detected distance takes a peak value at one point in the prior art, but in the device of the above embodiment, the peak thereof has a certain range. That is, as shown in FIG. 11, the light receiving spot area P of the phototransistor 5 is contained in the light emitting spot area L of the light emitting diode 4 in a wide distance range. Thus, when the light receiving spot area P of the phototransistor 5 is contained in the light emitting spot area L of the light emitting diode 4, an optical coupling portion is kept constant. Therefore, even if the optical axes of the light emitting diode 4 and phototransistor 5 are deviated when they are inserted into the receiving section 2 and 3, a collector current value in the phototransistor 5 is kept unchanged if the light receiving spot area P of the phototransistor 5 is contained in the light emitting spot area L of the light emitting diode 4. Further, variation in the peak position will not cause any serious problem since a constant collector current is output in a certain range. Therefore, the yield at the assembling process can be improved, the manufacturing cost can be lowered, the mass-productivity can be enhanced, erroneous detection can be prevented and the adjustment can be simplified or omitted.

In the above embodiment, the shape of the light transmission windows 10 and 11 formed in positions corresponding to the receiving sections 2 and 3 of the housing 1 is square as shown in FIG. 12. However, the shape thereof may be circular as shown in FIG. 13.

FIG. 14 shows a reflective type optical sensor device according to another embodiment of this invention partly in cross section. In the device of this embodiment, an external condenser lens 14 is further mounted on the light emitting surface of the infrared light emitting diode 4 having the outer casing formed integrally with the condenser lens 23. Likewise, an external condenser lens 15 is further mounted on the light receiving surface of the phototransistor 5 having the outer casing formed integrally with the condenser lens 23.

That is, the device of this embodiment is intended to improve the optical coupling characteristic by narrowing the beam by mounting the external condenser lenses 14 and 15.

In the device of this embodiment, the lens radii of the condenser lenses 23 formed integrally with the outer casings of the infrared light emitting diode 4 and phototransistor 5 are made equal to each other. On the other hand, the lens radius of the condenser lens 15 on the side of the phototransistor 5 is made smaller than that of the condenser lens 14 on the side of the infrared light emitting diode 4. That is, the curvature of the condenser lens 15 is made smaller than that of the condenser lens 14.

Even when the curvature of the external lens is thus made smaller on the light receiving side than on the light emitting side, the same effect as that obtained in a case wherein the opening areas of the light transmission windows formed in positions corresponding to the receiving sections 2 and of the housing 1 are made different from each other can be obtained.

Figure 16:
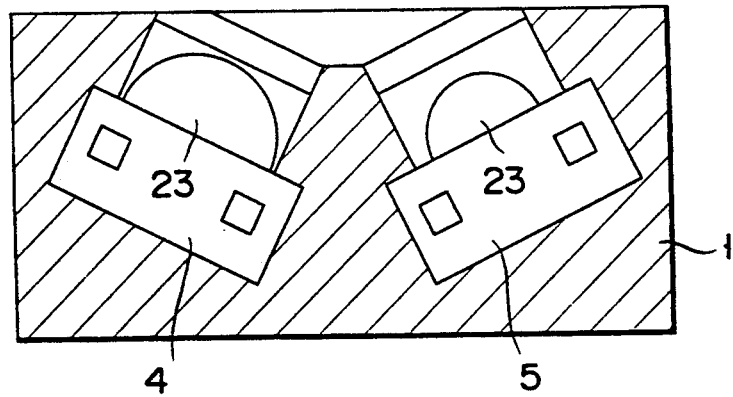
FIG. 16 is a view showing a device according to another embodiment of this invention partly in cross section.

In the above embodiment, the curvatures of the external lenses are made different from each other. However, it is also possible to set the curvature of the condenser lens 23 formed integrally with the outer casing of the phototransistor 5 different from the curvature of the condenser lens 23 formed integrally with the outer casing of the infrared light emitting diode 4 in the same manner as described above in a device having no external lens as shown in the embodiment of FIG. 16.

In the above embodiments, the infrared light emitting diode is used as the light emitting element. However, a visible light emitting diode such as red or green light emitting diode or laser diode can be used. Likewise, the phototransistor is used as the light receiving element. However, a photo IC including a phototransistor and an amplifier circuit can be used.

As described above, according to this invention, a reflective type optical sensor device can be provided in which erroneous detection can be prevented and the adjustment can be simplified or omitted.

What is claimed is:

1. A reflective type optical sensor device comprising:
   a housing having first and second receiving sections;
   a light-emitting device contained in the first receiving section of the housing;
   a light-receiving device contained in the second receiving section of the housing;
   a first window, formed in the housing, for permitting light emitted from the light-emitting device to pass therethrough; and
   a second window, having an area smaller than an area of the first window, formed in the housing for permitting the light emitted from the light-emitting device to be incident on the light-receiving device.

2. A reflective type optical sensor device according to claim 1, wherein said first and second windows are rectangular in shape.

3. A reflective type optical sensor device according to claim 1, wherein said first and second windows are circular in shape.

4. A reflective type optical sensor device according to claim 1, wherein said light-emitting device includes a light-emitting diode.

5. A reflective type optical sensor device according to claim 1, wherein said first and second receiving sections are formed such that a light axis of the light emitted from the light-emitting device and directed toward an object and a light axis of the light reflected by the object and incident on the light-receiving device form an angle which is in a range of 25° to 40°.

6. A reflective type optical sensor device comprising:
a housing having first and second receiving sections;
a light-emitting device contained in the first receiving section of the housing;
a light-receiving device contained in the second receiving section of the housing;
a first window, formed in the housing, for permitting light emitted from the light-emitting device to pass therethrough;
a second window, formed in the housing, for permitting the light emitted from the light-emitting device to be incident on the light-receiving device;
a first lens, arranged in the housing, for converging the light emitted from the light-emitting device; and
a second lens, arranged in the housing, for covering light to be incident on the light-receiving device, said second lens having a shorter radius of curvature than a radius of curvature of the first lens.

7. A reflective type optical sensor device according to claim 6, wherein said light-emitting device includes a light-emitting diode.

8. A reflective type optical sensor device according to claim 6, wherein said first and second receiving sections are formed such that a light axis of light emitted from the light-emitting device and directed toward an object and a light axis of the light reflected by the object and incident on the light-receiving device form an angle which is in a range of 25° to 40°.

9. A reflective type optical sensor device comprising:
a housing having first and second receiving sections;
a light-emitting device contained in the first receiving section of the housing;
a light-receiving device contained in the second receiving section of the housing;
a first window, formed in the housing, for permitting light emitted from the light-emitting device to pass therethrough;
a second window, formed in the housing, for permitting the light emitted from the light-emitting device to be incident on the light-receiving device;
a first lens, which is integrally formed with the light-emitting device, for converging the light emitted from the light-emitting device; and
a second lens, which is integrally formed with the light-receiving device, for converging light to be incident on the light-receiving device, said second lens having a shorter radius of curvature than a radius of curvature of the first lens.

10. A reflective type optical sensor device according to claim 9, wherein said first and second receiving sections are formed such that a light axis of light emitted from the light-emitting device and directed toward an object and a light axis of the light reflected by the object and incident on the light-receiving device form an angle which is in a range of 25° to 40°.

* * * * *

UNITED STATES PATENT AND TRADEMARK OFFICE
CERTIFICATE OF CORRECTION

PATENT NO. : 5,105,239
DATED : April 14, 1992
INVENTOR(S) : Tsuguo Uchino et al.

It is certified that error appears in the above-identified patent and that said Letters Patent is hereby corrected as shown below:

Claim 6, column 7, line 21, change "covering" to --converging--.

Signed and Sealed this

Twenty-sixth Day of October, 1993

Attest:

BRUCE LEHMAN

Attesting Officer

Commissioner of Patents and Trademarks